United States Patent
Hsu et al.

(10) Patent No.: US 7,382,654 B2
(45) Date of Patent: Jun. 3, 2008

(54) TRAPPING STORAGE FLASH MEMORY CELL STRUCTURE WITH INVERSION SOURCE AND DRAIN REGIONS

(75) Inventors: Chia-Lun Hsu, Taipei (TW); Mu-Yi Liu, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 74 days.

(21) Appl. No.: 11/394,649

(22) Filed: Mar. 31, 2006

(65) Prior Publication Data
US 2007/0230247 A1    Oct. 4, 2007

(51) Int. Cl.
*G11C 11/34* (2006.01)
(52) U.S. Cl. .................. 365/185.18; 365/185.14; 365/185.27
(58) Field of Classification Search ........... 365/185.14, 365/185.33, 365.18, 185.27; 257/315–324
See application file for complete search history.

(56) References Cited
U.S. PATENT DOCUMENTS 6,657,252 B2    12/2003  Fried et al.
6,925,007 B2 *  8/2005  Harari et al. ........... 365/185.15
2007/0076477 A1* 4/2007  Hwang et al. .......... 365/185.08

OTHER PUBLICATIONS

Xuan et al. "FinFET SONOS Flash Memory for Embedded Applications," IEEE 2003, pp. 26.4.1-26.4.4.
Hsu et al. "Split-Gate NAND Flash Memory at 120nm Technology Node Featuring Fast Programming and Erase," 2004 Symposium on VLSI Technology, Digest of Technical Papers, pp. 78-79.

* cited by examiner

*Primary Examiner*—Anh Phung
*Assistant Examiner*—Hien Nguyen
(74) *Attorney, Agent, or Firm*—Haynes Beffel & Wolfeld LLP

(57) ABSTRACT

Methods of manufacturing a nitride trapping EEPROM flash memory are described where each memory cell uses Si-FIN to form a nitride trapping EEPROM flash cell in which the source region and drain region are undoped. Each adjacent poly-gate to a selected poly-gate in a row of nitride trapping memory cells is used to produce the inversion region that acts as a source region or a drain region for transferring of a required voltage, which conserves the density of a memory cell given that the source region and the drain region for each memory cell are not doped. The flash memory includes a plurality of polysilicon layers intersecting with a plurality of Si-FIN layers.

6 Claims, 5 Drawing Sheets

TRAPPING STORAGE FLASH MEMORY CELL STRUCTURE WITH INVERSION SOURCE AND DRAIN REGIONS

BACKGROUND OF THE INVENTION

1. Field of the Invention

The present invention relates generally to nonvolatile memory devices, and more particularly, to charge-trapping flash memories.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names Nitride Read-Only Memory, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Nitride read-only memory devices use a relatively thick bottom oxide, e.g. greater than 3 nanometers, and typically about 5 to 9 nanometers, to prevent charge loss. Instead of direct tunneling, band-to-band tunneling induced hot hole injection (BTBTHH) can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of a nitride read-only memory flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology continues scaling down.

A typical nitride read-only memory flash memory cell structure positions a oxide-nitride-oxide layer between a conducting polysilicon and a crystalline silicon semiconductor substrate. The substrate refers to a source region and a drain region separated by an underlying channel region. A flash memory cell read can be executed by a drain sensing or a source sensing. For source side sensing, one or more source lines are coupled to source regions of memory cells for reading current from a particular memory cell in a memory array.

A traditional floating gate device only stores 1 bit per cell, but the advent of nitride read-only memory cells in which each nitride read-only memory cell provides 2 bits per flash cell that store charge in an oxide-nitride-oxide (ONO) dielectric. In a typical structure of a nitride read-only memory cell, a nitride layer is used as a trapping material positioned between a top oxide layer and a bottom oxide layer. The ONO layer structure effectively replaces the gate dielectric in floating gate devices. The charge in the ONO dielectric with a nitride layer may be either trapped on the left side or the right side of a nitride read-only memory cell.

A frequently used technique to program nitride read-only memory cells in a nitride read-only memory array is the channel hot electron injection method. During an erase operation, a common technique used to erase memory cells is called band-to-band hot hole injection. The other side potential, from the side that is being erased, of a nitride read-only memory cell is likely to have a lateral electric field effect on the eraseability. Evaluating the endurance and retention of a nitride read-only memory array, the lack of uniformity in eraseability causes a margin loss due to cycling and baking. The other side of nitride read-only memory cells is floating (or connected to ground) which may be coupled to an uncertain voltage level (e.g. 1 volt or 4 volts), which causes a variation of the erase threshold of array cells. This in turn causes Vt distribution after an erase operation to be wider. The variation of uncertain voltage level may result in over-erasing. On the other hand, if the other side is connected to ground, a punch-through may cause the pump circuit to crash when the bit line bias is over the punch-through voltage. Consequently, during an erase operation of a block, the nitride read-only memory cells, where some of the nodes are left floating, may cause lack of uniformity in voltage level applied for erasing the nitride read-only memory cells in a nitride read-only memory array.

As technology advances in flash memory devices, it is desirable to design a charge trapping flash memory cell structure that provides higher package density as well as superior device scalability.

SUMMARY OF THE INVENTION

The present invention describes methods for manufacturing a charge-trapping flash memory having a plurality of two-bit charge trapping cells where each memory cell is formed with a fin-shaped channel structure referred to herein as an Si-FIN layer, with inverted source and drain regions. Each adjacent poly-gate to a selected poly-gate in a row of the memory cells is used to produce the inversion region that acts as a source region or a drain region for transferring of a required voltage, which conserves the density of a memory cell given that the source region and the drain region for each memory cell are not doped. The flash memory includes a plurality of polysilicon layers intersecting with a plurality of Si-FiN layers. When a memory cell is selected in a row of memory cells for executing a program operation, an erase operation, or a read operation, a first set of memory cells on the left side of the selected memory cell serves as passing gates for passing a first voltage toward the selected memory cell, and a second set of memory cells on the right side of the selected memory cell serves as passing gates for passing a second voltage toward the selected memory cell.

In a first operational method, the method includes conducting the following sequence of operations to a charge-trapping memory array in which the source and drain regions of each memory cell are formed by inversion of the channel structure under adjacent cells: a Fowler-Nordheim tunneling (FN) erase to a selected gate, a hot hole (HH) program to the selected gate, and a read operation to the selected gate. In a second operational method, the method includes conducting the following operations to a charge-trapping memory array in which the source and drain regions of each memory cell are: formed by inversion of the channel structure under adjacent cells: a channel hot electron (CHE) program is directed toward to a selected gate, a hot hole erase is directed toward the selected gate, and a read operation is directed toward the selected gate. For each operational step, a particular memory cell in a row is selected for execution to either program, erase, or read, while other memory cells in that row serve as passing gates for passing a required voltage.

Broadly stated, a flash memory array comprises a first charge-trapping memory cell having a gate electrode, an inversion source region, and an inversion drain region; a second charge-trapping memory cell positioned adjacent to a first side of the first memory cell, the first memory cell having a gate electrode, an inversion source region, and an inversion drain region; a third charge-trapping memory cell positioned adjacent to a second side of the first memory cell, the third memory cell having a gate electrode, an inversion source region, and an inversion drain region; and an Si-FiN layer extending orthogonally across the first charge-trapping memory cell, the second charge-trapping memory cell, and the third charge-trapping memory cell.

Advantageously, the present invention produces a more compact charge trapping memory that is highly scalable because the source region and the drain region for each cell are formed by inversion of the channel structure under adjacent cells and each cell does not reserve or occupy space for source and drain implantations.

The structures and methods of the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

DETAILED DESCRIPTION OF EMBODIMENTS OF THE INVENTION

Figure 1A:
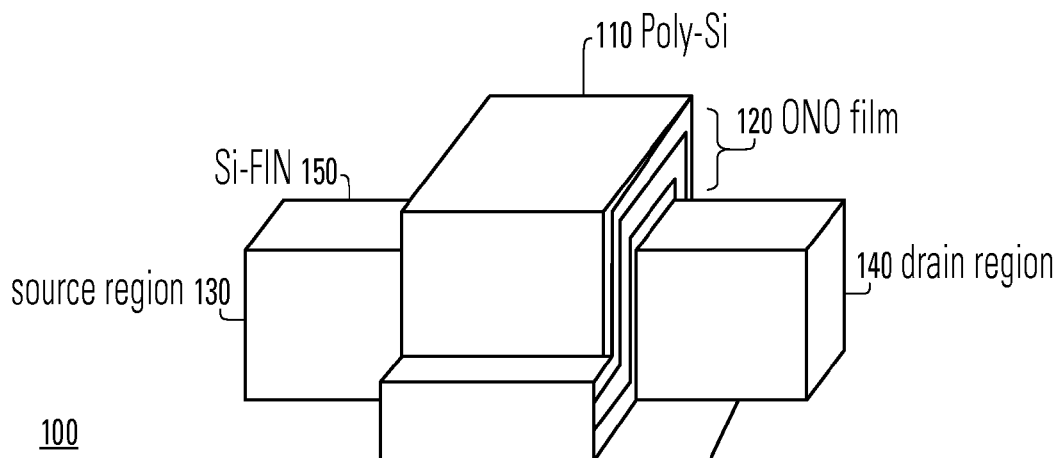
FIG. 1A is a structural diagram illustrating a charge trapping flash cell with Si-FIN in accordance with one embodiment of the present invention.

Referring now to FIG. 1A, there is shown a structural diagram illustrating a charge trapping EEPROM flash cell structure 100 with Si-FiN. The structure 100 includes a polysilicon (or poly-gate) layer 110 overlaying an oxide-nitride-oxide (ONO) film 120 with a source region 130 on the left side and a drain region 140 on the right side. The ONO film 120 provides a charge trapping structure for a two-bit operation with a first bit on the left side and a second bit on the right side. An Si-FiN 150 extends in a direction that is perpendicular to the polysilicon layer 110. The source region 130 and the drain region 140 are formed by inversion of the channel structure under adjacent cells, i.e. there is no implant in the source region 130 and the drain region 140. Rather, the structure 100 makes use of the adjacent poly-gate 110 to produce the inversion region to act as a source/drain region for passing a required voltage. The source/drain region is confined to a small region for inversion, which results in a small cell size as well as high scalability.

Figure 1B:
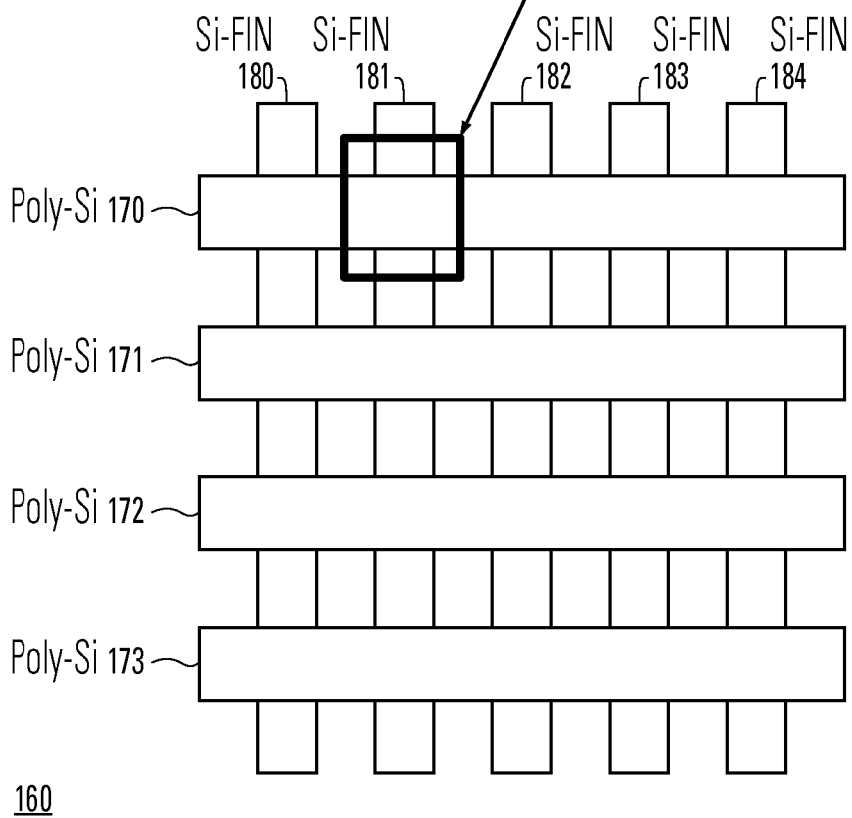
FIG. 1B is a layout diagram illustrating a charge trapping flash cell with Si-FIN in accordance with one embodiment of the present invention.

As shown in FIG. 1B, there is a layout diagram illustrating an array 160 of memory cells with the positioning of the polysilicon layers intersecting with Si-FIN layers. A multiple number of rows of polysilicon layers 170, 171, 172 and 173 are positioned substantially orthogonal with respect to a multiple number of columns of Si-FIN layers 180, 181, 182, 183 and 184. Each of the Si-FIN layers extends across a plurality of polisilicon layers. For example, the Si-FIN 180 layer extends across the polysilicon layer 170, the polysilicon layer 171, the polysilicon layer 172 and the polysilicon layer 173. The drain region 140 in FIG. 1A is shown in FIG. 1B where a portion of the polysilicon 170 intersects with a portion of the Si-FIN 181.

The charge trapping flash cell structure 100 is able to carry out two-bit operations with an illustrative first type which involves FN erasing and hot hole programming, and an illustrative second type which involves hot hole erasing and channel hot electron for programming. The type of operation with FN erasing and hot hole programming can be performed in two approaches. In the first approach, the two bits on both sides of a charge trapping cell are erased to a high state (FN tunneling, electrons in the nitride film). While applying the voltages of about 1.5 volts and about zero volts, respectively, to the far left end and the far right end of the selected charge trapping cell, the right side with the high Vt is read. While applying the voltages of about zero volts and about 1.5 volts, respectively, to the far left end and the far right end of the selected cell, the left side with the high Vt is read. In the second approach, one of the two sides of the charge trapping cell is programmed to a low state. The right side of the nitride film (i.e., a charge trapping film) is programmed using hot hole injection. While applying the voltages of about 1.5 volts and about zero volts, respectively, to the far left end and the far right end of the selected cell, the programmed side with low Vt is read. While applying the voltages of about zero volts and about 1.5 volts, respectively, to the far left end and the far right end of the selected cell, the un-programmed side with high Vt is read.

The second type of operation with hot hole erasing and channel hot electron programming can also be carried out in two approaches. In the first approach, the two bits on both sides of a charge trapping cell are erased to a low state. While applying the voltages of about 1.5 volts and about zero volts, respectively, to the far left end and the far right end of the selected cell, the right side with low Vt is read. While applying the voltages of about zero volts and about 1.5 volts, respectively, to the far left end and the far right end of the selected cell, the left side with low Vt is read. In the second approach, one of the two sides of the charge trapping cell is programmed to a high state, e.g. if the right side of the nitride film is programmed with channel hot electron injection. While applying the voltages of about 1.5 volts and about zero volts, respectively, to the far left end and the far right end of the selected cell, the programmed side with high Vt is read. While applying the voltages of about zero volts and about 1.5 volts, respectively, to the far left end and the far right end of the selected charge trapping cell, the un-programmed side with low Vt is read.

Figure 2A:
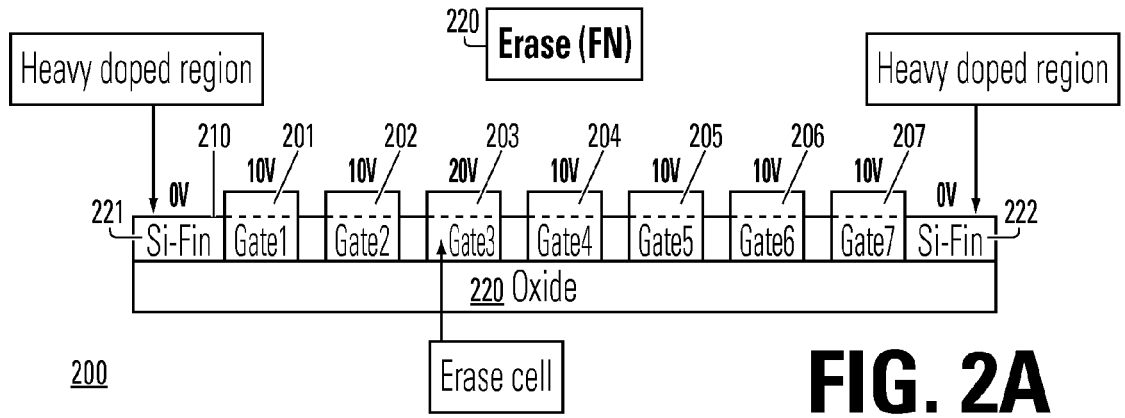
FIGS. 2A-C are circuit diagrams illustrating a first operational method in erasing, programming and reading of a charge trapping flash memory array in accordance with one embodiment of the present invention.
Figure 2B:
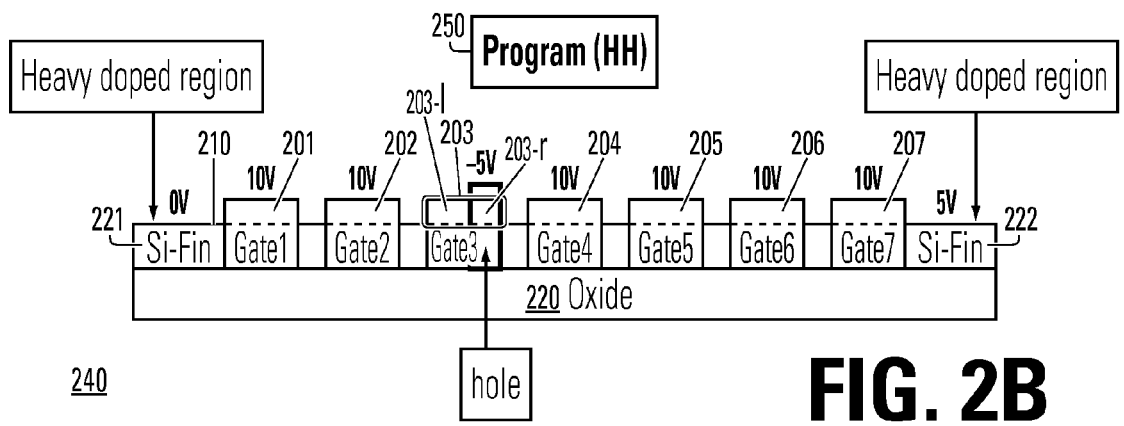
Figure 2C:
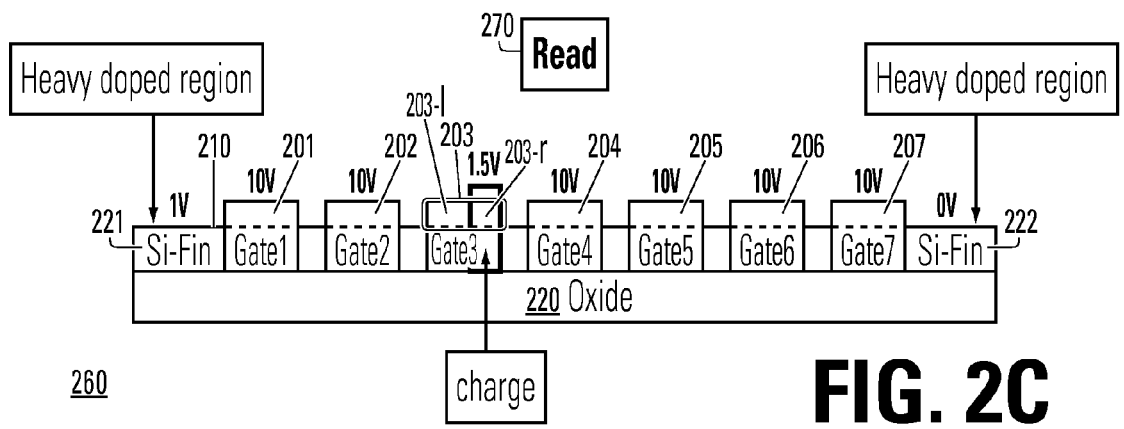

In FIGS. 2A-C, there are shown circuit diagrams illustrating a first operational method in erasing 200 including bias circuitry 220, programming 240 including bias circuitry 250, and reading 260 including bias circuitry 270, respectively, of the charge trapping flash memory array 160. In this first operational method, the method is carried out in the following method: erase a memory cell using Fowler-Nordheim tunneling, program the memory cell using hot hole injection, and read the memory cell. As shown in FIG. 2A, if a gate3 203 is to be erased, the rest of the gate cells, the gate1 201, the gate2 202, the gate4 204, the gate5 205, the gate6 206 and the gate7 207 function as pass gates for transferring a voltage. The term "gate" in the present specification is also referred to as "a gate cell," or "a gate in charge trapping memory cell". The gate cells, the gate1 201, the gate2 202, the gate4 204, the gate5 205, the gate6 206, and the gate7 207 are charged to a first voltage level, e.g. 10 volts, while the gate3 cell is charged up to a second voltage level, e.g. 20 volts, for erasing the gate3 cell using FN tunneling. An Si-FiN layer 210 has p-type, for example, conductivity extends from the left side of the gate1 201 all the way across to the right side of the gate7 207, extending through the gate1 201, the gate2 202, the gate3 203, the gate4 204, the gate5 205, the gate6 206 and the gate7 207 without intervening terminals having the opposite conductivity type. The gate1 201, the gate2 202, the gate3 203, the gate4 204, the gate5 205, the gate6 206, and the gate7 207 are disposed on an oxide layer 220. The silicon 230 is heavily doped to form a terminal 222 of the opposite conductivity type adjacent to the right side of the gate7 207 and disposed above the oxide 220. The silicon 230 is also doped to form terminal 221 adjacent gate1 201.

After the erase operation, the sequence proceeds to operation 240 to program a charge trapping memory cell using hot hole injection as illustrated in FIG. 2B. The gate3 203 is a nitride read-only memory cell having two bits with a first bit on the left side and a second bit on the right side. The programming of the gate3 203 using hot hole injection is applied to the right side 203-$r$ of the gate3 203. The right side 203-$r$ of the gate3 203 has a higher voltage potential, which is set to approximately 5 volts, relative to the left side 203-$l$ of the gate3 203, which is set to approximately zero volts. The voltage differential of 5 volts between the right side 203-$r$ and the left side 203-$l$, creates a hot hole scenario on the right side, which causes storage in a nitride layer associated with the gate3 203.

Alternatively, the programming of the gate3 203 using hot hole injection can be applied to the left side 203-$l$ of the gate3 203. The left side 203-$l$ of the gate3 203 has a higher voltage potential, which is set to approximately 5 volts, relative to the right side 203-$r$ of the gate3 203, which is set to approximately zero volts. The voltage differential of 5 volts between the left side 203-$l$ and the right side 203-$r$ creates a hot hole on the left side, which causes a charge-storage in the nitride layer associated with the gate3 cell 203.

Therefore, the programming of the gate3 203 using a hot hole injection can be either applied on the right side 203-$r$ or the left side 203-$l$ of the gate3 203.

After the program operation, the sequence proceeds to operation 260 for reading the gate3 cell 203. The charge is stored on the right side 203-$r$ of the gate3 203 so that the read operation is conducted on the left side 203-$l$ of the gate3 203. The threshold voltage, Vt, will tend to drift higher over time. Although the above illustration shows a charge stored on the right side 203-$r$ of the gate3 203 and the read operation conducted on the left side 203-$l$ of the gate3 cell 203, one of ordinary skill in the art should recognize that the charge can also be stored on the left side, while the read operation is conducted on the right side.

When the gate3 203 is selected for executing either an erase operation, a program operation, or a read operation, the remaining neighboring cells, the gate1 201, the gate2 202, the gate4 204, the gate5 205, the gate6 206, and the gate7 207 serve as passing gates. One advantage of the present invention is that it reduces the amount of circuitry in a memory array by using neighboring cells as passing gates, instead of a conventional solution which requires an additional gate associated with each memory cell to operate as a passing gate. For example, if the gate5 205 is selected to be erased, then the gate1 201, the gate2 202, the gate3 203, the gate4 204, the gate6 206, and the gate7 207 serve as passing gates for passing a voltage to the gate5 205.

Figure 3A:
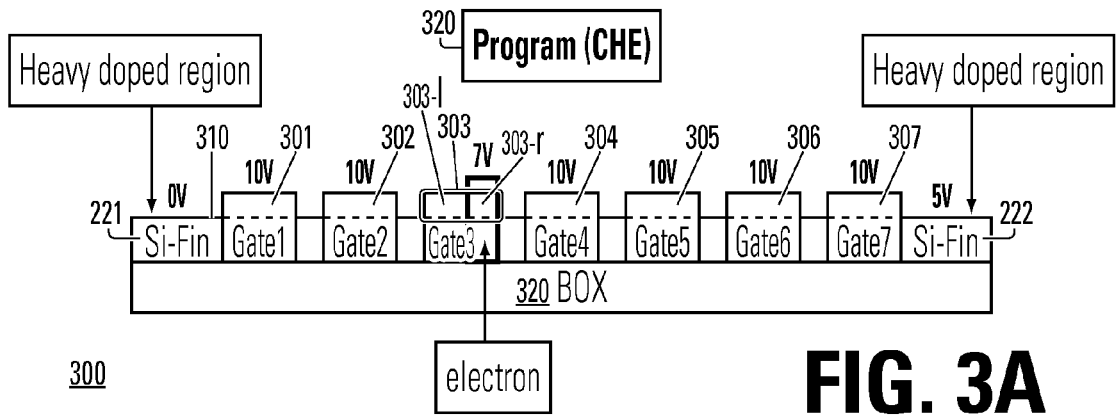
FIGS. 3A-C are circuit diagrams illustrating a second operational method in programming, erasing and reading of a charge trapping flash memory array in accordance with one embodiment of the present invention.
Figure 3B:
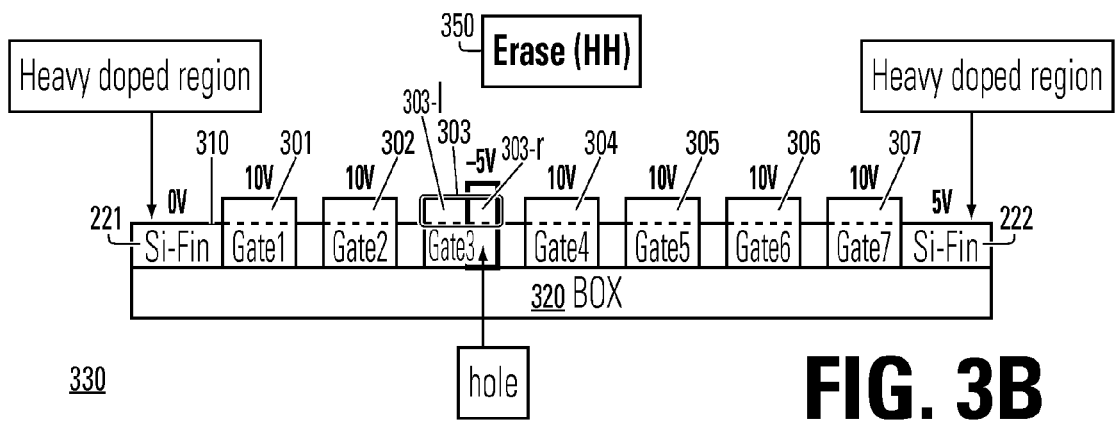
Figure 3C:
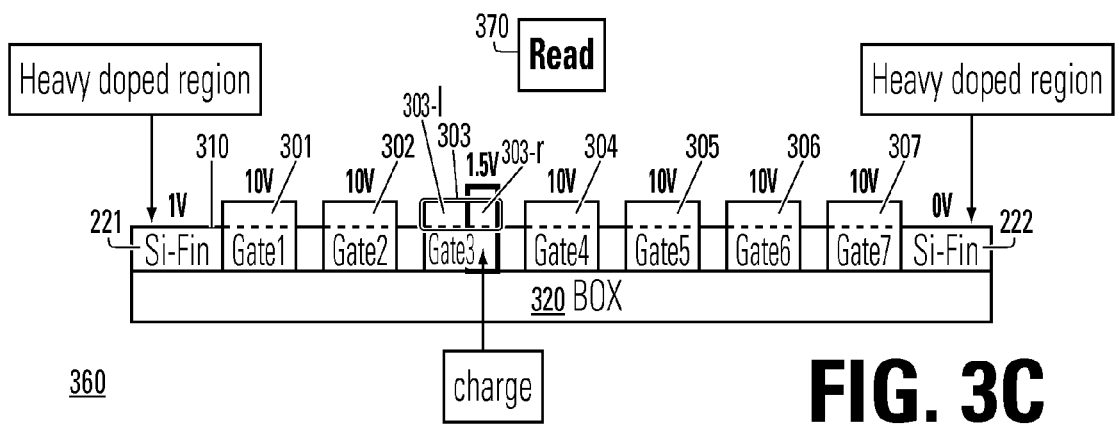

FIGS. 3A-C are circuit diagrams illustrating a second operational method in programming, erasing and reading of a charge trapping flash memory array. In the second operational method, the sequence is to program a memory cell, erase the memory cell, and read the memory cell. As shown in FIG. 3A, if a gate3 303 is selected for programming using a channel hot electron (CHE), the right side 303-$r$ of the gate3 303 is approximately 5 volts, while the left side 303-1 of the gate3 303 is approximately zero volts using bias circuitry 320. On the left side of the gate3 303, a gate1 301 and a gate2 302 serve as passing gates for passing a voltage to the left side of the gate3 303. The gate1 301 passes zero volts to the gate2 302, which passes zero volts to the left side 303-$l$ of the gate3 303. On the right side of the gate3 303, a gate4 304, a gate5 305, a gate6 306, and a gate7 307 serve as passing gates for passing a voltage to the right side of the gate3 303. The gate7 307 passes 5 volts from to the gate6 306, which passes 5 volts to the gate5 305, which passes 5 volts to the gate4 304, which passes 5 volts to the right side 303-$r$ of the gate3 303.

After passing the zero volts to the left side 303-$l$ of the gate3 303 and passing 5 volts to the right side 303-$r$ of the gate3 303, a channel hot electron is created. The zero volts from the left side 303-$l$ accelerates electrons toward the right side 303-$r$ which is about 5 volts, and the accelerated electrons called hot electrons are injected into the nitride layer (the ONO film 120) due to the higher potential of poly-gate3 303 to which is applied 7 volts. The right side 303-$r$ of the gate3 303 is then programmed by channel hot electron injection.

FIG. 3B is a circuit diagram illustrating an erase operation by hot hole injection of the charge trapping flash memory array 160. If the gate3 303 is selected for erase, the rest of the gate cells, the gate1 301, the gate2 302, the gate4 304, the gate5 305, the gate6 306 and the gate7 307, function as pass gates for the transferring of a voltage. The gate cells, the gate1 301, the gate2 302, the gate4 304, the gate5 305, the gate7 307 are charged using bias circuitry 350 to a first voltage level, e.g. 10 volts, while the gate3 303 is injected with hot hole for −5 volts on the right side 303-$r$ of the gate3

303. An Si-FiN 310 layer extends from the left side of the gate1 301 all the way across to the right side of the gate7 307, which includes extending through the gate1 301, the gate2 302, the gate3 303, the gate4 304, the gate5 305, the gate6 306, and the gate7 307. The gate1 301, the gate2 302, the gate3 303, the gate4 304, the gate5 305, the gate6 306, the gate7 307 are disposed on an oxide layer 320. A silicon Fin 330 is heavily doped on the right side of the gate7 307 and the left side of the gate1 301. The silicon Fin 330 is disposed above the oxide layer 320.

After the erase operation, the sequence proceeds to an operation 360 for reading the gate3 303 using bias circuitry 370. The charge is stored on the right side 303-$r$ of the gate3 303 so that the read operation is conducted on the left side 303-$l$ of the gate3 303. The threshold voltage, Vt, will tend to drift higher over time. Although the above illustration shows a charge stored on the right side 303-$r$ of the gate3 303 and the read operation conducted on the left side 303-$l$ of the gate3 303, one of ordinary skill in the art should recognize that the charge can also be stored on the left side, while the read operation is conducted on the right side.

One difference between the first operational method 200 and the second operational method 300 is the inverse relationship between the low threshold voltage and the high threshold voltage. The first operational method 200 erases a memory cell using FN tunneling, which erases the memory cell to a high threshold voltage. The second operational method 300 erases a memory cell using a hot hole technique, which erases the memory cell to a low threshold voltage.

Figure 4:
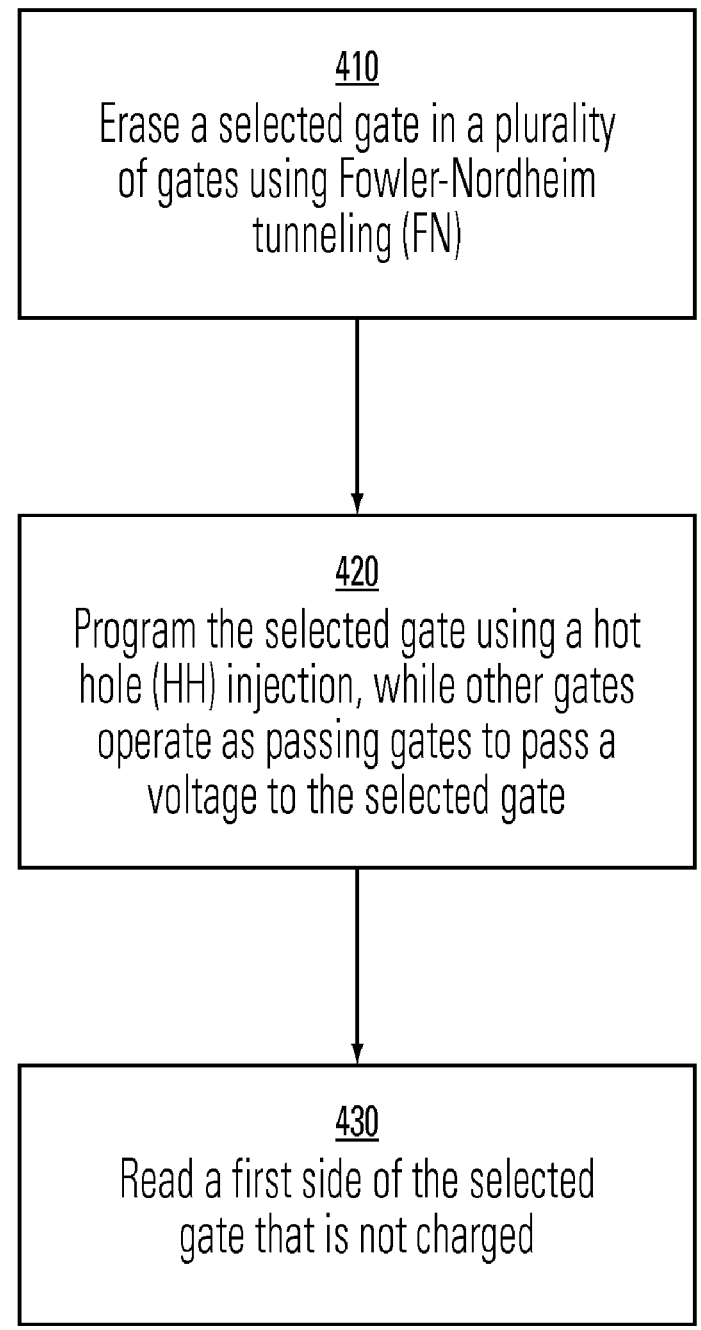
FIG. 4 is a flow chart illustrating the process in performing the first operational method in accordance with one embodiment of the present invention.

FIG. 4 is a flow chart illustrating the process in performing the first operational method 400 in erasing 200, programming 240, and reading 260 the charge trapping flash memory array 160. At step 410, the first operational method 400 selects the gate3 203 in the row to be erased by using Fowler-Nordheim tunneling, while other gates, the gate1 201, the gate2 202, the gate4 204, the gate5 205, the gate6 206 and the gate7 207 function as pass gates for the transferring of a voltage. The gates that are not selected, the gate1 201, the gate2 202, the gate4 204, the gate5 205, the gate6 206, and the gate7 207 are charged to a first voltage level, e.g. 10 volts, while the gate4 204 is charged up to a second voltage level, e.g. 20 volts, for erasing the gate3 203 using FN tunneling.

At step 420, the first operational method 400 programs the gate3 203 using hot hole injection in the charge trapping flash memory array 160. The programming of the gate3 203 uses hot hole injection that is applied to the right side 203-$r$ of the gate3 203. The right side 203-$r$ of the gate3 203 has a higher voltage potential, which is set to approximately 5 volts, relative to the left side 203-$l$ of the gate3 203, which is set approximately to zero volts. If the gate is selected, a negative −5 volts is applied to the gate3 203. The voltage differential of 10 volts between the right side 203-$r$ and the top side gate3 203 creates a hot hole injection on the right side 203-$r$, which causes a storage in the nitride layer associated with the gate3 203.

At step 430, the first operational method 400 includes performing a read operation of the gate3 203 in the charge trapping flash memory array 160. The charge is stored on the right side 203-$r$ of the gate3 203 so that the read operation is conducted on the left side 203-$l$ of the gate3 203. The threshold voltage, Vt, will tend to drift higher over time when the gate3 203 is being erased. Although the above illustration shows a charge being stored on the right side 203-$r$ of the gate3 203 and the read operation being conducted on the left side 203-$l$ of the gate3 203, one of ordinary skill in the art should recognize that the charge can be stored on the left side, while the read operation is conducted on the right side.

Figure 5:
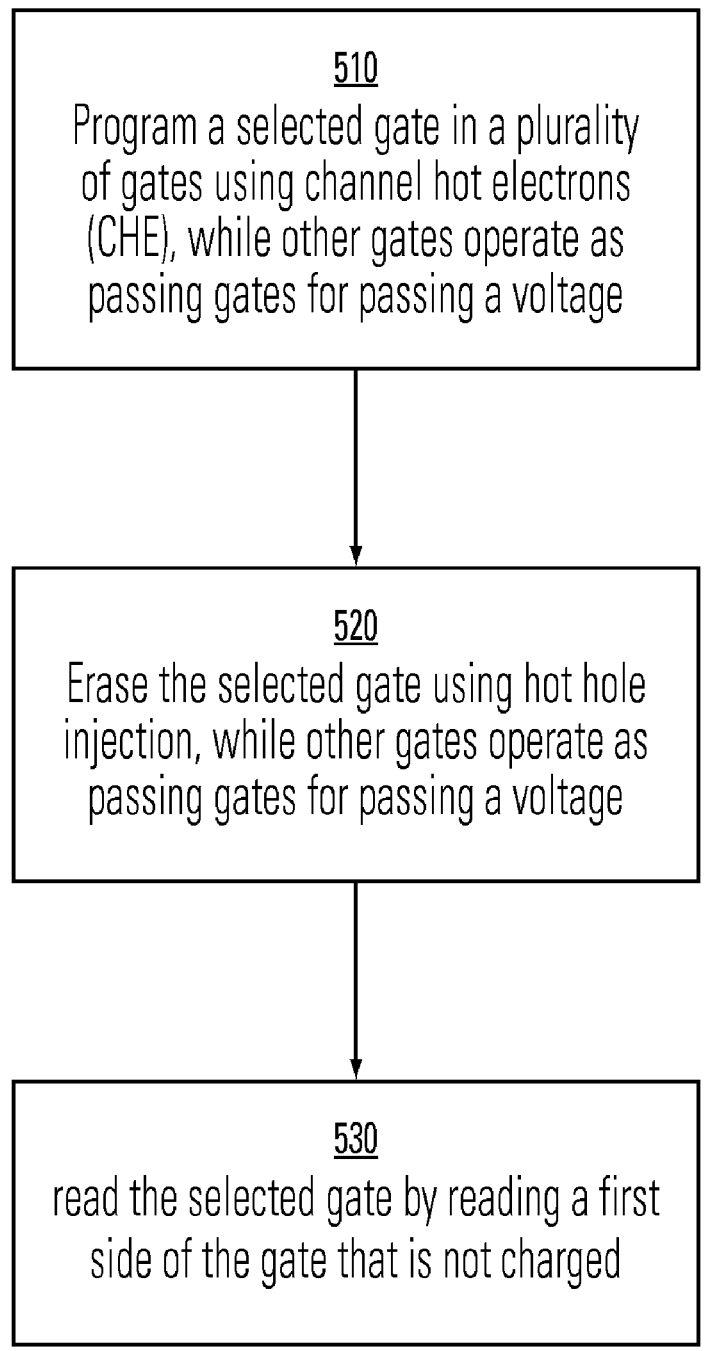
FIG. 5 is a flow chart illustrating the process in performing the second operational method in accordance with one embodiment of the present invention.

FIG. 5 is a flow chart illustrating the process of a second operational method 500 in conducting the operation of programming, erasing, and reading the charge trapping flash memory array 160. At step 510, the second operational method 500 includes programming the selected gate3 203 for programming using a channel hot electron technique. The right side 303-$r$ of the gate3 303 is approximately 5 volts, while the left side 303-$l$ of the gate3 303 is approximately zero volts. On the left side of the gate3 303, the gate1 301 and the gate2 302 serve as passing gates for passing a voltage to the left side of the gate3 303. The gate1 301 passes zero volts to the gate2 302, which passes zero volts to the left side 303-$l$ of the gate3 303. On the right side of the gate3 303, the gate4 304, the gate5 305, the gate6 306, and the gate7 307 serve as passing gates for passing a program voltage to the right side of the gate3 303. The gate7 307 passes 5 volts to the gate6 306, which passes 5 volts to the gate5 305, which passes 5 volts to the gate4 304, which passes 5 volts to the right side 303-$r$ of the gate3 303. After passing zero volts to the left side 303-$l$ of the gate3 303 and passing 5 volts to the right side 303-$r$ of the gate3 303, a channel hot electron scenario is created. The zero volts from the left side 303-$l$ accelerates electrons toward the right side 303-$r$ which is at about 5 volts, and the accelerated electrons, referred to as hot electrons, are injected into the nitride layer (the ONO film 120) as a result of the higher potential of poly-gate3 303 to which 7 volts is applied. The right side 303-$r$ of the gate3 303 is then programmed by channel hot electron injection.

At step 520, the second operational method 500 includes performing an erase operation by hot hole injection of the charge trapping flash memory array 300. If the gate3 303 is selected to be erased, the rest of the gate cells, the gate1 301, the gate2 302, the gate4 304, the gate5 305, the gate6 306 and the gate7 307 function as pass gates for transferring a voltage to the gate3 303. The gate cells, the gate1 301, the gate2 302, the gate4 304, the gate5 305, the gate7 307 are charged to a first voltage level, e.g. 10 volts, while the gate3 303 is erased using hot hole injection with 5 volts on the right side 303-$r$ which is passed from the right side of the Si-FIN 310 heavy doped region and a −5 volts is applied to the gate3 303.

At step 530, the second operational method 500 includes performing a read operation of the gate3 303. The charge is stored on the right side 303-$r$ of the gate3 303 so that the read operation is conducted on the left side 303-$l$ of the gate3 303. The threshold voltage, Vt, will tend to drift higher over time.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A flash memory array, comprising:
   a first charge trapping memory cell having a gate electrode overlaying a first charge trapping film;
   a second charge trapping memory cell positioned adjacent to a first side of the first memory cell, the second memory cell having a gate electrode overlaying a second charge trapping film;

a third charge trapping memory cell positioned adjacent to a second side of the first memory cell, the third memory cell having a gate electrode overlaying a third charge trapping film; and a fin-shaped channel having one of an n-type or p-type conductivity extending orthogonally across the first charge trapping memory cell, the second charge trapping memory cell, and the third charge trapping memory cell, without intervening terminals having a different conductivity type.

2. The flash memory array of claim 1 wherein the gate electrode of the second charge trapping memory cell is arranged so that an applied bias voltage on the gate electrode produces an inversion region to act as a source region or a drain region for passing a first voltage to the first side of the first charge trapping memory cell through the fin-shaped channel.

3. The flash memory array of claim 1 wherein the gate electrode of the third charge trapping memory cell is arranged so that an applied bias voltage on the gate electrode produces an inversion region to act as a source region or a drain region for passing a second voltage to the second side of the first charge trapping memory cell through the fin-shaped channel.

4. The flash memory array of claim 1 further comprising an insulating layer on a substrate, and beneath the fin-shaped channel structure, insulating the fin-shaped channel structure from the substrate.

5. A flash memory array, comprising:

a plurality of fin-shaped channel structures on a semiconductor substrate, the channel structures respectively having one of an n-type or p-type conductivity, a first terminal having a different conductivity type and a second terminal spaced away from the first terminal having the different conductivity type, without intervening terminals having the different conductivity type;

a plurality of word lines, arranged orthogonally with respect to the plurality of fin-shaped channel structures, the plurality of word lines including at least three word lines overlying the plurality of fin-shaped channel structures between the respective first and second terminals;

charge trapping structures, including a dielectric charge trapping layer between, and at the cross-points of, the plurality of word lines and the plurality of fin-shaped channel structures, so that an array of memory cells is provided; and biasing circuits arranged to apply bias voltages to the respective first and second terminals of the plurality of fin-shaped channel structures and to the plurality of word lines, including biasing voltages that induce inversion regions in the fin-shaped channel structure for conducting voltages from the first and second terminals to a selected memory cell.

6. The flash memory array of claim 5, including an insulating layer between the plurality of fin-shaped channel structures and the semiconductor substrate.

* * * * *